United States Patent [19]

Pfiester

[11] Patent Number: 5,200,352

[45] Date of Patent: Apr. 6, 1993

[54] TRANSISTOR HAVING A LIGHTLY DOPED REGION AND METHOD OF FORMATION

[75] Inventor: James R. Pfiester, Austin, Tex.

[73] Assignee: Motorola Inc., Schaumburg, Ill.

[21] Appl. No.: 797,580

[22] Filed: Nov. 25, 1991

[51] Int. Cl.[5] ........................................ H01L 21/265
[52] U.S. Cl. ...................................... 437/44; 437/34; 437/40; 437/41; 257/344; 257/900
[58] Field of Search ................. 437/44, 40, 43, 41, 437/34; 357/23.3

[56] References Cited

U.S. PATENT DOCUMENTS

| | | | |
|---|---|---|---|
| 4,886,765 | 12/1989 | Chen et al. | 437/44 |
| 4,931,408 | 6/1990 | Hshieh | 437/44 |
| 4,998,150 | 3/1991 | Rodder et al. | 357/23.1 |
| 5,079,180 | 1/1992 | Rodder et al. | 437/44 |
| 5,082,794 | 1/1992 | Pfiester et al. | 437/44 |

Primary Examiner—Brian E. Hearn
Assistant Examiner—Kevin M. Picardat
Attorney, Agent, or Firm—Robert L. King

[57] ABSTRACT

A transistor (10 or 11) and method of formation. The transistor (10) has a substrate (12). The substrate (12) has an overlying dielectric layer (14) and an insulated conductive control electrode (16) which overlies the dielectric layer (14). A dielectric region (18) overlies the insulated conductive control electrode (16), and a dielectric region (20) is adjacent to the insulated conductive control electrode (16). A spacer (30) is adjacent to the dielectric region (20). Epitaxial regions (24) are adjacent to the spacer (30) and the spacer (30) is overlying portions of the epitaxial regions (24). A dielectric region (26) overlies the epitaxial regions (24). Highly doped source and drain regions (32) underlie the epitaxial regions (24). LDD regions (28), which are underlying the spacer (30), are adjacent to and electrically connected to the source and drain regions (32).

20 Claims, 3 Drawing Sheets

TRANSISTOR HAVING A LIGHTLY DOPED REGION AND METHOD OF FORMATION

FIELD OF THE INVENTION

The present invention relates generally to semiconductor technology, and more particularly, to MOS and bipolar transistors.

BACKGROUND OF THE INVENTION

The lightly doped drain (LDD) metal oxide semiconductor (MOS) field effect transistor (FET), or LDD MOSFET, is a transistor that has a drain region and a source region, each with a shallow lightly doped region adjacent a channel region, and a deeper, heavily doped region adjacent the shallow lightly doped region. The LDD MOSFET was developed by the integrated circuit industry for several reasons. The main reason for developing the LDD MOSFET was for use in reducing a known and understood hot carrier injection phenomenon. Hot carrier injection can degrade device performance and device lifetime and LDD formations are successful in reducing hot carrier injection effects.

To improve the performance of the LDD MOSFET over time, transistor material layer thicknesses and LDD MOSFET cell surface areas were reduced. Because of these advances and reductions, known phenomenon such as threshold voltage instability caused by boron penetration, doping outdiffusion, short channel effects, leakage currents, increased capacitance, and reduced isolation caused integrated circuit designers to search for new methods of making new LDD transistors more reliable.

Integrated circuit designers developed an elevated source and drain MOSFET to overcome some of the problems discussed above. The elevated source and drain MOSFET used source and drain regions physically raised off of the substrate surface to reduce short channel effects and doping outdiffusion. The elevated source and drain MOSFET has the disadvantage of having a high probability that a salicide or silicide layer could electrically short a source or drain to the substrate via a known spiking phenomenon. The spiking phenomenon is usually related to faceting in epitaxial growths along material boundaries. Faceting is a phenomenon that causes non-uniform or retarded growth epitaxial regions along epitaxial-to-dielectric boundaries. The electrical shorting caused by faceting or spiking renders the electrically shorted device inoperable. The elevated source and drain MOSFET also has the disadvantage of producing source and drain regions that may not have a constant junction depth. This variation in junction depth can effect device performance, capacitance, isolation, and other essential device characteristics and parameters.

While the LDD and elevated source and drain MOSFETs were still in need of improvements, bipolar and complementary metal oxide semiconductor (CMOS) transistors were being merged into a new technology commonly referred to as BiCMOS. BiCMOS technology added new problems and considerations to the course of research in MOSFET technology. BiCMOS technology, for most processes, usually results in added processing steps and therefore added process complexity. Conventional BiCMOS technology can also result in devices that further hinder device size reduction and device performance in both the bipolar regime and the CMOS regime. Currently, a process or a device that eliminates the disadvantages of the LDD and elevated source and drain MOSFETs does no exist.

SUMMARY OF THE INVENTION

The previously mentioned needs are fulfilled and other advantages achieved with the present invention. In one form, the present invention comprises a transistor and a process for fabricating the transistor. A substrate material is provided with an insulated conductive control region overlying the substrate material, and a dielectric region overlying the insulated conductive control region. A first spacer is formed adjacent to a perimeter of the insulated conductive control region. Portions of the substrate material are exposed, and epitaxial regions are formed from the exposed portions of the substrate material. The epitaxial regions are formed adjacent to the first spacer. The first spacer is removed forming doping accessible portions of the substrate material. The doping accessible portions of the substrate material are doped forming a first doped region and a second doped region. A second spacer adjacent the insulated conductive control region is formed. The second spacer partially overlies the epitaxial region. The epitaxial region is doped to form a third doped region and a fourth doped region.

The present invention will be understood by one skilled in the art from the detailed description below in conjunction with the accompanying drawings.

DESCRIPTION OF THE PREFERRED EMBODIMENT

Figure 1A:
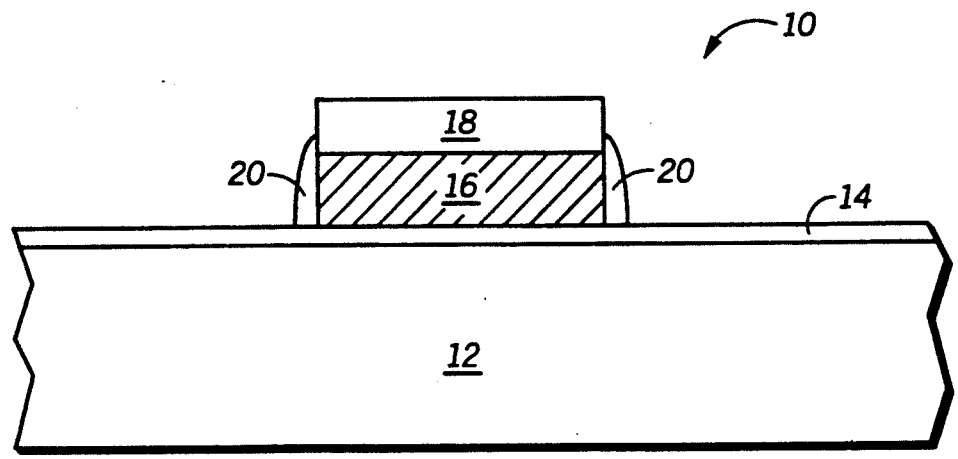
FIGS. 1A-1E illustrate, in cross-sectional form, a process for fabricating a transistor in accordance with the present invention.

In FIG. 1A is a cross-section of an MOS transistor 10. The MOS transistor 10 has a substrate 12, and substrate 12 can be made from any semiconductive material such as silicon, epitaxial silicon, germanium, gallium-arsenide, or the like. A dielectric layer 14 is formed overlying the substrate. The dielectric layer 14 is usually a thermally grown, dry silicon dioxide, but can be oxide-nitride-oxide (ONO) or a similar dielectric material. An insulated conductive control region or gate 16 is formed overlying the dielectric layer 14. The gate 16 is usually made of polysilicon or a similar conductive material. A dielectric region 18 is formed overlying the gate 16. The dielectric region 18 can be nitride, silicon dioxide ($SiO_2$), tetra-ethyl-ortho-silicate (TEOS), boro-phosphate-silicate-glass (BPSG), or a similar dielectric. The gate 16 is reoxidized to form the dielectric regions 20. The dielectric regions 20 protect the gate 16, and ensure that the gate 16 is electrically isolated.

Figure 1B:
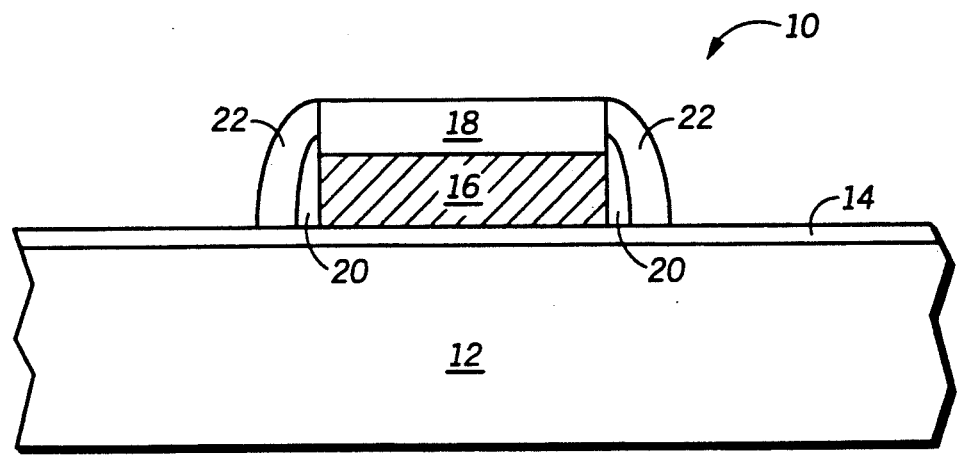

FIG. 1B illustrates a first spacer formation step. A first spacer 22 is formed overlying the dielectric layer 14 and adjacent to the dielectric regions 18 and 20. The spacer 22 is usually made from a dielectric material. Many different dielectrics can be used for the spacer 22. Different dielectrics have different etch characteristics and dielectric properties. Therefore, different combinations of dielectric materials for dielectric region 18 and spacer 22 result in various advantages and flexibility. The advantages and flexibility of varying the dielectric material for various formations will be subsequently discussed in reference to other figures.

Figure 1C:
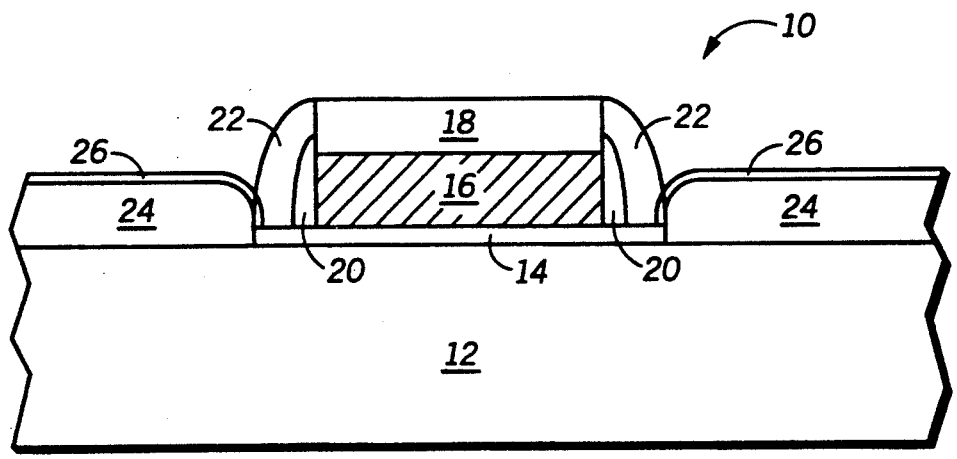

The dielectric layer 14 that is not underlying the gate 16, the dielectric region 20, or the spacer 22 is removed by conventional selective etch processing as illustrated in FIG. 1C. The etch of dielectric region 14 exposes two portions the substrate 12. Referring to FIG. 1C, a first portion of the substrate 12 is located on the left side of gate 16 and a second portion of the substrate 12 is located on the right side of gate 16. Epitaxial regions 24 are grown from the exposed portions of the substrate 12. The epitaxial regions 24 both overlie the substrate 12. The epitaxial regions 24 both overlie the substrate 12 and are adjacent to the spacer 22. A dielectric region 26 is formed overlying the epitaxial regions 24. Dielectric region 26 will encroach and form between the epitaxial regions 24 and the spacer 22. When epitaxial growth is performed adjacent to an interface of a different material, such as oxide or nitride, a sloped formation or a retarded growth region forms along that interface. This retarded growth formation, formed by a phenomenon called faceting, is illustrated for epitaxial regions 24 by the fact that portions of epitaxial regions 24 adjacent to the spacer 22 are sloped and non-uniform.

Figure 1D:
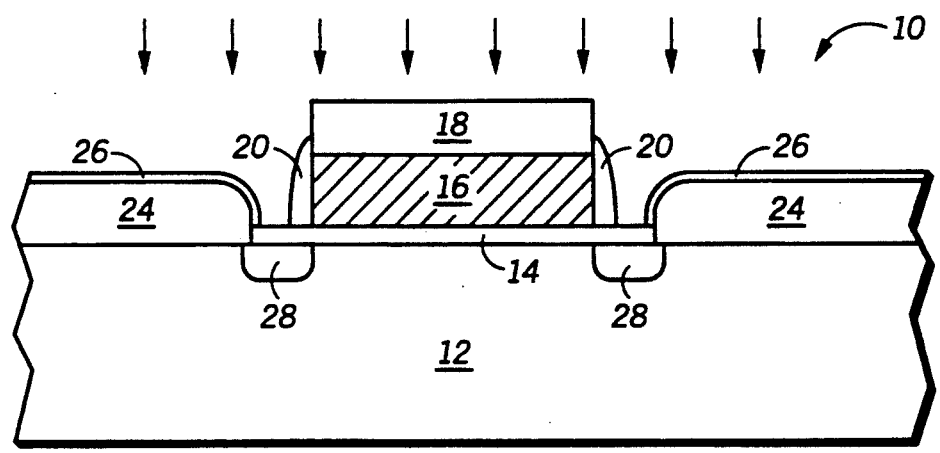

The spacer 22 is etched away to expose two portions of the dielectric layer 14 that are adjacent to the epitaxial regions 24, as illustrated in FIG. 1D. The two exposed portions formed by the spacer 22 etch are now doping accessible portions of the substrate 12. A Doping step, usually an ion implantation process, is performed which creates a first doped region and a second doped region adjacent to the epitaxial regions 24 and underlying dielectric layer 14. These doped regions are referred to as lightly doped drain regions or LDD regions 28. Due to the fact that the LDD regions are formed after the high temperature epitaxial step of FIG. 1C, the LDD regions of FIG. 1D are outdiffused less and have a doping profile that is more controllable than conventional LDD structures. In addition, reduced outdiffusion results in better isolation and more accurate, consistent transistor channel lengths. The dielectric regions 20 along with reduced outdiffusion keeps the LDD regions 28 from substantially forming or subsequently and substantially diffusing underneath the gate 16. The ability to keep the LDD regions 28 from substantially underlying the gate 16 will reduce gate-to-source and gate-to-drain capacitance, which is widely known as Miller capacitance.

Figure 1E:
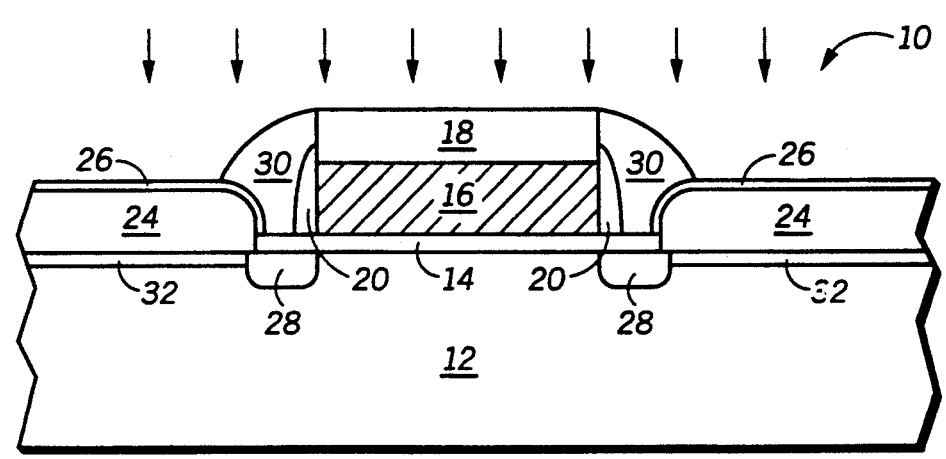

A second spacer 30 is formed overlying the LDD regions 28 as illustrated in FIG. 1E. The second spacer 30 is formed between the dielectric regions 20 and the epitaxial region 24. The spacer 30 fills the open region formed by the etch of the spacer 22. Therefore, spacer 30 is used to reduce the occurrence of topography-related problems that occur when forming overlying conductive layers such as metal. The spacer 30 overlies the faceting portions of the epitaxial regions 24 that are non-uniform and sloped due to faceting that occurs along the spacer 22 (illustrated in FIG. 1C). The epitaxial regions 24 are doped, usually via ion implantation. The ion implantation of the epitaxial regions is very uniform due to the fact that the spacer 30 covers the faceting regions of the epitaxial regions 24. The spacer 30 also protects the MOS transistor 10 from a phenomena known as spiking. Spiking occurs when salicide regions that overlie and contact to source and drain regions "spike" through the source and drain regions and electrically short circuit the source and drain regions to the substrate. This electrical short circuiting renders any device useless.

Subsequent processing, such as overlying conductive layer formation and heat cycles, drives the doping of the epitaxial regions into the substrate to form source and drain regions 32. The source and drain regions 32 underlie the epitaxial regions 24 and respectively electrically contact to the LDD regions 28 that are adjacent to the epitaxial regions 24. Because the source and drain regions 32 are driven into the substrate, leakage current and other problems relating to dielectric-to-epitaxial-material interfaces regions are not observed due to the fact that all epitaxial interface regions are isolated from all source-to-substrate and drain-to-substrate junctions. Due to the fact that the ion implant, which doped the epitaxial region, was uniform, the source an drain regions 32 are very uniform. The source and drain regions 32 are also not vertically deep into the substrate. The small vertical depth of the source and drain regions 32 into the substrate improves isolation between the MOS transistor 10 and other neighboring devices. The small vertical depth of the source and drain regions 32 also helps to decrease known and unwanted short channel effects and decreases off-current leakage, which is current that leaks through a transistor device when the device is functioning in a logic "off" state.

In a CMOS application, the diffusion coefficients of N-type versus P-type wells and sources and drains are different. This is due to the fact that the a P-type dopant (boron) diffuses faster than an N-type dopant (arsenic). This difference in diffusion results in junctions that are not of equal depth for P-type and N-type CMOS transistors. Because of unequal depth, the transistors will also operate with different characteristics. This is undesirable and can be prevented with the MOS transistor 10.

This junction depth difference is prevented by first implanting N-type devices, usually with arsenic or a similar atom as a dopant, and exposing the arsenic to a heat cycle. This heat cycle drives the arsenic or a similar dopant deeper into the epitaxial regions 24. Following this heat cycle, boron or an equivalent is implanted and driven via a second heat cycle. Due to the fact that the arsenic was already driven partially, the arsenic has less distance to diffuse relative to the boron before forming a substrate source or drain junction. Therefore, the slower diffusion of arsenic, when compared to boron, is compensated for, and the junction depths of the P-type and N-type devices should be roughly equal. In addition, a phosphorus and arsenic co-implant, also known as a dual species implant, can be used to give similar results. Due to this diffusion balancing method, epitaxial regions 24 can also be made thicker, and greater epitaxial thickness will help circuit topography.

In addition, depending upon whether the dielectric region 18 and the spacer 22 are different materials or similar materials, other process options exist in connection with the cross-section of FIG. 1E. For example, if the dielectric region 18 is made of TEOS, and the spacer 22 is made of nitride, then dielectric region 18 is not etched very much during the removal of the spacer 22. Therefore, dielectric region 18 is vertically thick and prevents the gate 16 from being doped by the ion implant that is used to dope the epitaxial regions 24. The gate 16 must therefore be separately doped prior to or after the epitaxial regions 24 are ion implanted. If the spacer 22 and the dielectric region 18 are both nitride for example, the dielectric region 18 would be partially or completely removed during the spacer 22 etch step and therefore not protect the gate from ion implantation. This loss of gate protection can result in the doping of the gate 16 and the epitaxial regions 24 with the same single doping step. Both the protection of the gate 16 from epitaxial doping and therefore the separate doping of the gate 16 from the epitaxial regions 24, and the simultaneous doping of the gate 16 and the epitaxial regions 24 have different advantages.

Separate doping results in a more customized doping scheme. Separate doping also allows the epitaxial regions 24 and the gate 16 to be ion implanted before diffusion critical regions such as LDD regions 28 are formed. The doping of the epitaxial regions and the gate 16 before formation of the LDD regions 28 allows high temperature cycles to repair known implant damage and drive dopant atoms to form the source and drain regions 32 before diffusion critical regions such as the LDD regions 28 are formed. Simultaneous doping after selective epitaxial growth allows for a reduction in process steps, reduced boron penetration from the gate electrode into adjacent regions during high temperature cycles such as epitaxial growth steps of pre-clean steps, and improved doping uniformity.

Figure 2:
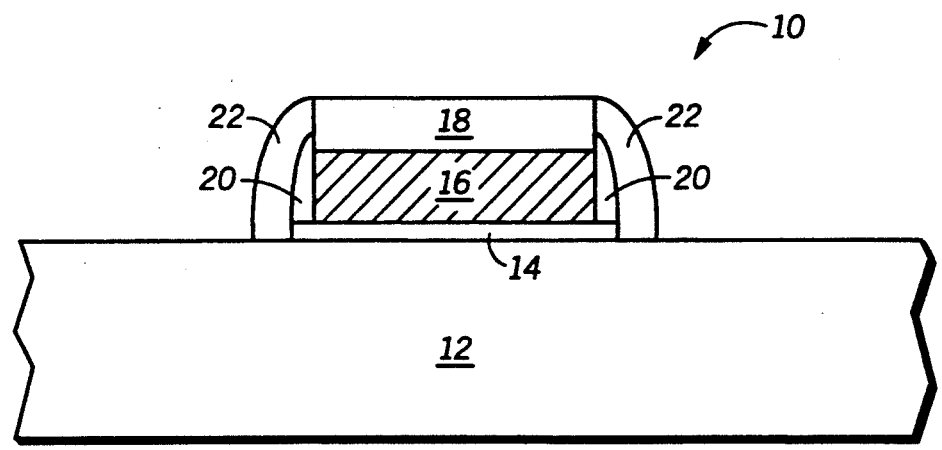
FIG. 2 illustrates, in cross-sectional form, an alternative process step for the process of FIG. 1 in accordance with the present invention.

FIG. 2 illustrates a cross-section of an alternative spacer 22 formation. FIG. 2 can take the place of FIG. 1B. In FIG. 2, an etch step is performed to remove dielectric layer 14 from all regions not covered by gate 16 or dielectric regions 20. The spacer 22 is then formed overlying and contacting the substrate. The etch step for FIG. 2 also exposes portions of the substrate which can be used for epitaxial growth. The advantage of this alternative is that the dielectric layer 14, which now serves as a gate dielectric, is not exposed to epitaxial regions 24 and their epitaxial processing sequence. Therefore conventional epitaxial problems, such as hydrogen contamination, are reduced or avoided in the MOS critical gate dielectric region. It should also be noted that the protection received by the gate is largely a function of what materials are used for the formation of dielectric region 18, gate 16, spacer 22, and the substrate 12.

Figure 3:
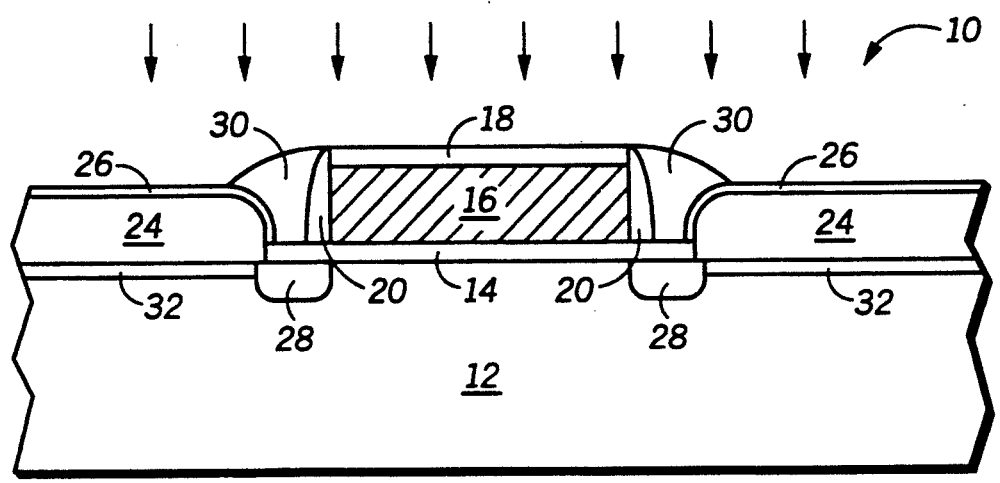
FIG. 3 illustrates, in cross-sectional form, an alternative embodiment of the transistor of FIG. 1E in accordance with the present invention.

FIG. 3 illustrates in more detail the simultaneous doping of the gate 16 and the epitaxial regions 24 that was described above. Assuming that the dielectric region 18 and the spacer 22 are both made from the same material, then the dielectric region 18 is removed or at least partially etched during the etch of the spacer 22. This etch is illustrated in FIG. 3 by having a dielectric region 18 that is reduced in vertical height. Therefore, the gate 16 is not protected from the implant of the epitaxial regions 24, and the gate 16 and the epitaxial regions 24 are doped by the same ion implanting process step.

Figure 4:
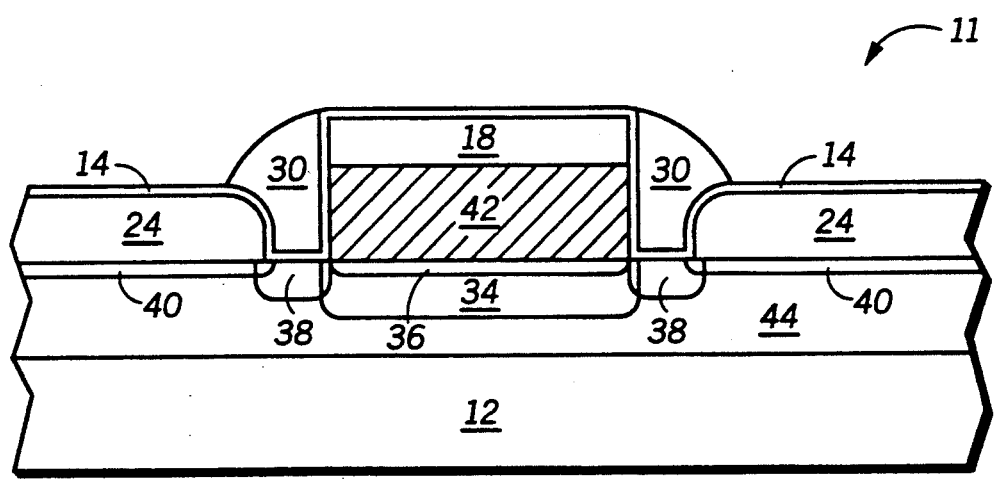
FIG. 4 illustrates, in cross-sectional form, a bipolar transistor embodiment that can be fabricated from the process of FIG. 1 in accordance with the present invention.

In the integrated circuit industry, the compatibility of bipolar technology and CMOS technology is very important. BiCMOS technology would not be possible or feasible if bipolar processing and CMOS processing were radically different. FIG. 4 illustrates how a bipolar transistor 11 can be made from the same process that is illustrated for the MOS transistor 10 in FIG. 1. Due to the fact that the process for forming the bipolar transistor 11 is very similar to the MOS transistor 20 process, some process steps will be discussed only briefly. Also, several regions and layers between bipolar transistor 11 and MOS transistor 10 are similar. This similarity allows the bipolar transistor 11 and the MOS transistor 10 to have several identically labeled layers and regions.

FIG. 4 illustrates a bipolar transistor 11. The entire bipolar transistor is formed overlying a doped well region 44 that acts as a collector electrode for bipolar transistor 11. The bipolar transistor 11 is formed overlying a substrate 12. Unlike the MOS transistor 10, the bipolar transistor 11 has an emitter region 42, which is nearly identical to the gate 16 of MOS transistor 10, except that emitter region 42 is in contact with the substrate 12. The emitter region 42 contact to the substrate 12 is achieved by etching the dielectric layer 14 away from the areas of the bipolar transistor 11 which are to be used to form the emitter region 42. This bipolar etch step will not etch the dielectric layer 14 overlying the substrate 12 for MOS transistor 10. In other words, MOS transistor 10 is masked from the bipolar dielectric layer 14 etch step. The emitter region 42 of the bipolar transistor 11 is then formed overlying and directly contacting to the substrate. A doped region 34 is formed within the substrate underlying the emitter region 42. In most cases, the doped region 34 and doped well region 44 is formed early in the process along with conventional CMOS complementary doped wells. The doped region 34 forms a portion of a base electrode for the bipolar transistor 11. A dielectric region 18 is placed overlying the gate 16 for the MOS transistor 10 and the emitter region 42 of the bipolar transistor 11. The bipolar dielectric region 18 has all of the benefits discussed for MOS transistor 10 in FIG. 1 and FIG. 3.

Epitaxial regions 24 for bipolar transistor 11 are formed using a spacer (not illustrated in FIG. 4, but illustrated in FIG. 1C for MOS transistor 10). The epitaxial regions 24 are covered with a dielectric epitaxial-covering layer. The dielectric epitaxial-covering layer is also labeled as dielectric layer 14 even though dielectric layer 14 was described above. The identical labeling of these two dielectric layers is due to the fact that, unlike the MOS transistor 10, the two dielectric layers interact more and are harder to distinguish between in a functional manner for the bipolar transistor 11. In other words, dielectric layer 14 for the MOS transistor 10 was used as a gate dielectric and no gate dielectric exists for the bipolar transistor 11. Therefore, no theoretical distinction can be made between the two dielectric layers of bipolar transistor 11 an they are both referred to as dielectric layer 14. It should be noted that several MOS transistor 10 CMOS-compatible steps may be needed to form the dielectric layer 14 as described and illustrated herein for bipolar transistor 11.

The spacer 22 (illustrated in FIG. 1C) is removed and LDD regions 28 are formed for MOS transistor 10. A similar structure is formed for the bipolar transistor 11 of FIG. 4, but this similar structure serves a different function. The LDD formation implant used in the MOS transistor 10 forms physically equivalent base connection regions 38 for bipolar transistor 11. The epitaxial regions 24 are then ion implanted with a base region doping type. Subsequent processing drives dopant atoms from the epitaxial regions 24 into the substrate 12 to form doped regions 40. Together, the doped regions 40 and 34 and base connection regions 38 form a complete, electrically-connected base electrode for the bipolar transistor 11. The subsequent processing also drives dopant atoms from the emitter region 42 forming a doped emitter extension region 36 within the substrate 12. Together, the emitter region 42 and the doped emitter extension region 36 form an emitter electrode for the bipolar transistor 11.

Therefore, with three or four process flow variations or additions, a bipolar device can be made from the same CMOS process flow and allow for the fabrication of BiCMOS circuits with a high degree of process compatibility and repeatability.

Presented herein is an inventive MOS transistor that offers: (1) improved isolation; (2) improved short channel and hot carrier behavior; (3) reduced junction outdiffusion; (4) more controllable channel length definition; (5) Improved sub-micron geometry reduction potential; (6) compatibility to BiCMOS processing; (7) shallower junction depths; (8) less topography-related problems for overlying conductive layers; (9) reduction in salicide or silicide spiking related failures; (10) less processing steps when compared to other advanced BiCMOS processing schemes; (11) reduced substrate leakage current; (12) the possibility for reduced boron penetration into gate dielectric and other surrounding regions if gate regions are doped simultaneously with epitaxial regions after epitaxial growth; (13) improved device protection from epitaxial processing (e.g. hydrogen contamination); (14) reduced Miller capacitance and (15) improved off-current due to shallower junctions.

Presented herein is an inventive bipolar transistor that offers: (1) improved isolation; (2) reduced reduction outdiffusion; (3) Improved sub-micron geometry reduction potential; (4) compatibility to BiCMOS processing; (5) shallower junction depths; (6) less topography-related problems for overlying conductive layers; (7) reduction in salicide or silicide spiking related failures; (8) less processing steps when compared to other advanced BiCMOS processing schemes; (9) reduced substrate leakage current; and (10) improved device protection from epitaxial processing (e.g. hydrogen contamination) in a manner similar to the inventive MOS device described herein.

While the present invention has been illustrated and described with reference to specific embodiments, further modifications and improvements will occur to those skilled in the art. Various materials, such as polysilicon, silicon dioxide, and the like, described herein can vary greatly. For example, polysilicon can be replaced with epitaxial silicon and still serve the same basic function. Some minor additions and alterations may be necessary for the process flow in order to simultaneously make the bipolar transistor and the CMOS transistor when manufacturing BiCMOS devices. Other technology can be added to these devices, such as threshold voltage implants, various doping schemes, and thermal processing. It is to be understood, therefore, that this invention is not limited to the particular forms illustrated and that it is intended in the appended claims to cover all modifications that do not depart from the spirit and scope of this invention.

I claim:

1. A process for fabricating a transistor comprising:
   providing a substrate material;
   providing an insulated conductive control region overlying the substrate material, and providing a dielectric region overlying the insulated conductive control region;
   forming a first spacer adjacent a perimeter of the insulated conductive control region;
   forming exposed portions of the substrate material;
   forming an epitaxial region from the exposed portions of the substrate material, the epitaxial region being adjacent to the first spacer;
   removing the first spacer, the first spacer removal forming doping-accessible portions of the substrate material;
   doping the doping-accessible portions of the substrate material after removing the first spacer to form both a first doped region and a second doped region within the substrate material;
   forming a second spacer adjacent to the insulated conductive control region, the second spacer partially overlying the epitaxial region; and
   doping the epitaxial region to form a third doped region and a fourth doped region.

2. The process of claim 1 wherein the doping of the epitaxial region further comprises doping the third doped region more than the first doped region, and doping the fourth doped region more than the second doped region, the first doped region being electrically connected to the third doped region, the first and third doped regions forming a drain, and the second doped region being electrically connected to the fourth doped region, the second and fourth doped regions forming a source.

3. The process of claim 1 wherein the forming of an epitaxial region further comprises forming a dielectric layer overlying the epitaxial region.

4. The process of claim 1 wherein the forming of the third and fourth doped regions further comprises driving doped third and fourth region dopants from the epitaxial region into the substrate material respectively forming heavily doped source and drain regions.

5. The process of claim 1 wherein the forming of the third and fourth doped regions further comprises simultaneously doping the insulated conductive control region to form a gate.

6. The process of claim 1 further comprising:
   forming the first, second, third, and fourth doped regions of a first conductivity type, each of the first, second, third and fourth doped regions acting as a portion of a base;
   doping the conductive control electrode with a second conductivity type;
   forming a fifth doped region of the second conductivity type underlying and electrically connected to the conductive control electrode, the fifth doped region and the conductive control electrode functioning as an emitter;
   forming a sixth doped region of the first conductivity type surrounding the fifth doped region, the sixth doped region electrically connecting to the first and second doped regions, the sixth doped region completing formation of the base; and
   forming a seventh doped region surrounding each of the first, second, third, fourth, fifth, and sixth doped regions, the seventh doped region functioning as a collector.

7. The process of claim 1 wherein the first, second, third, and fourth doped regions respectively have first, second, third, and fourth doping depths, the first and third doped regions being electrically connected, and the second and fourth doped regions being electrically connected, the first doping depth being greater than the third doping depth, and the second doping depth being greater than the fourth doping depth.

8. The process of claim 1 wherein the doping of the epitaxial region further comprises doping N-type epitaxial regions with a dual species.

9. The process of claim 1 wherein the doping of the epitaxial region further comprise the sequential steps of:
doping N-channel transistor epitaxial regions with an N-type dopant;
heating the epitaxial regions which have an N-type dopant;
doping P-channel transistor epitaxial regions with a P-type dopant; and
heating both the N-type and P-type epitaxial regions to drive the P-type and N-type dopants, the heating of both the N-type and P-type epitaxial regions forming source and drain regions within the substrate, the source and drain regions having a shallow and substantially equal depth.

10. The process for forming a lightly doped drain transistor on a substrate material wherein the transistor has an insulated conductive gate overlying the substrate material, the process comprising:
forming a lightly doped source region and a lightly doped drain region adjacent the insulated conductive gate, the lightly doped source and drain regions each having a doping depth; and
forming a heavily doped source region and a heavily doped drain region of the second conductivity type and respectively adjacent the lightly doped source and drain regions, the heavily doped source region having a first interface with the substrate material and a second interface with the lightly doped source region and the heavily doped drain region having a first interface with the substrate material and a second interface with the lightly doped drain region, the heavily doped source and drain regions each having a doping depth, the respective doping depth of the lightly doped source and drain regions being greater than the respective doping depth of the heavily doped source and drain regions.

11. The process of claim 10 wherein the forming of the lightly doped drain region and the lightly doped source region comprises:
using ion implantation to form both the lightly doped drain region and the lightly doped source region.

12. The process of claim 10 wherein the forming of the heavily doped drain region and the heavily doped source region comprises:
using ion implantation to form the heavily doped drain region and the heavily doped source region; and
heating the heavily doped drain region and the heavily doped source region to drive the heavily doped drain region and the heavily doped source region into the substrate material.

13. The process of claim 10 further comprising:
forming an epitaxial region over each of the heavily doped drain region and the heavily doped source region.

14. The process of claim 10 wherein the forming of the lightly doped source region and the lightly doped drain region comprise:
forming a doping-accessible portion of the substrate material by removing a spacer which is adjacent said insulated conductive gate; and
doping the substrate material through the doping-accessible portion of the substrate material to form the lightly doped source regions and the lightly doped drain region.

15. The process for forming a lightly doped drain transistor on a substrate material wherein said transistor has an insulated conductive region which overlies the substrate material, the process comprising:
forming a lightly doped region adjacent the insulated conductive region and within the substrate material, the lightly doped region having both a doping depth and a doping width, the doping width being measured substantially perpendicular from the insulated conductive region and outward across the lightly doped region; and
forming a heavily doped region adjacent the lightly doped region, the heavily doped region having both a doping depth and a doping width, the doping width being measured in the same direction as the doping width of the lightly doped drain region, the doping depth of the lightly doped region being greater than the doping depth of the heavily doped region, the doping width of the lightly doped region being less than the doping width of the heavily doped region, the lightly doped region being positioned closer to the insulated conductive region than the heavily doped region.

16. The process of claim 15 wherein the forming of the lightly doped region and the heavily doped region forms an electrode of the transistor wherein the transistor is a bipolar transistor.

17. The process of claim 15 further comprising:
electrically coupling the heavily doped region and the lightly doped region to form one of either a source or a drain of said transistor.

18. The process of claim 15 further comprising:
forming an epitaxial region over the heavily doped region.

19. The process of claim 15 further comprising:
forming a sidewall spacer adjacent said insulated conductive region;
forming a doping-accessible portion of the substrate material by removing the sidewall spacer; and
forming said lightly doped region by doping the substrate material through the doping-accessible portion of the substrate material.

20. The process for forming a doping-accessible portion of a substrate material comprising:
forming a first region of material to mask a first portion of the substrate material;
forming a spacer adjacent the first region of material, the spacer having a first surface that is adjacent the first region of material, and having a second surface opposite the first surface;
forming a second region of material adjacent the second surface of the spacer to mask a second portion of the substrate material;
removing the spacer to form said doping-accessible portion of the substrate material, the doping-accessible portion of the substrate material being between the first region of material and the second region of material; and
doping the doping-accessible portion of the substrate material to form a portion of a current electrode of a device.

* * * * *